US006891379B2

(12) United States Patent
Kelly et al.

(10) Patent No.: US 6,891,379 B2
(45) Date of Patent: May 10, 2005

(54) EKG WIRING SYSTEM

(75) Inventors: Clifford Mark Kelly, Windham, NH (US); Bernd Rosenfeldt, Hamilton, MA (US)

(73) Assignee: Draeger Medical System, Inc., Danvers, MA (US)

( * ) Notice: Subject to any disclaimer, the term of this patent is extended or adjusted under 35 U.S.C. 154(b) by 0 days.

(21) Appl. No.: 10/647,647

(22) Filed: Aug. 25, 2003

(65) Prior Publication Data

US 2004/0105245 A1 Jun. 3, 2004

Related U.S. Application Data

(60) Provisional application No. 60/408,018, filed on Sep. 4, 2002.

(51) Int. Cl.[7] ........................ G01R 27/04

(52) U.S. Cl. ........................ 324/539; 600/383

(58) Field of Search ........................ 324/539; 600/383

(56) References Cited

U.S. PATENT DOCUMENTS

| | | | | | |
|---|---|---|---|---|---|
| 4,251,794 | A | | 2/1981 | Swenson | 338/26 |
| 4,280,507 | A | * | 7/1981 | Rosenberg | 600/508 |
| 4,328,814 | A | | 5/1982 | Arkans | 128/640 |
| 4,353,372 | A | | 10/1982 | Ayer | 128/640 |
| 4,583,549 | A | | 4/1986 | Manoli | 128/640 |
| 4,784,557 | A | | 11/1988 | Gies et al. | 414/45 |
| 4,854,323 | A | | 8/1989 | Rubin | 128/644 |
| 4,967,040 | A | | 10/1990 | Viaud et al. | 174/36 |
| 5,265,579 | A | | 11/1993 | Ferrari | 128/640 |
| 5,327,888 | A | | 7/1994 | Imran | 128/640 |
| 5,341,806 | A | | 8/1994 | Gadsby et al. | 128/640 |
| 5,370,116 | A | | 12/1994 | Rollman et al. | 128/644 |
| 5,377,687 | A | | 1/1995 | Evans et al. | 128/700 |
| 5,445,162 | A | * | 8/1995 | Ives | 600/544 |
| 5,511,553 | A | | 4/1996 | Segalowitz | 128/696 |
| 5,546,950 | A | | 8/1996 | Schoeckert et al. | 128/696 |
| 5,622,168 | A | * | 4/1997 | Keusch et al. | 600/391 |
| 5,678,545 | A | | 10/1997 | Stratbucker | 128/640 |
| 5,685,303 | A | * | 11/1997 | Rollman et al. | 600/390 |
| 5,813,979 | A | | 9/1998 | Wolfer | 600/393 |
| 5,865,741 | A | | 2/1999 | Kelly et al. | 600/386 |
| 6,032,065 | A | | 2/2000 | Brown | 600/383 |
| 6,049,730 | A | * | 4/2000 | Kristbjarnarson | 600/509 |
| 6,066,093 | A | | 5/2000 | Kelly et al. | 600/386 |
| 6,157,851 | A | | 12/2000 | Kelly et al. | 600/386 |
| 6,173,198 | B1 | | 1/2001 | Schulze et al. | 600/382 |
| 6,195,884 | B1 | | 3/2001 | Miyamoto et al. | 29/857 |
| 6,219,568 | B1 | | 4/2001 | Kelly et al. | 600/386 |
| 6,219,569 | B1 | | 4/2001 | Kelly et al. | 600/386 |
| 6,246,902 | B1 | | 6/2001 | Naylor et al. | 600/509 |
| 6,259,939 | B1 | | 7/2001 | Rogel | 600/390 |
| 6,360,119 | B1 | | 3/2002 | Roberts | 600/509 |
| 6,400,975 | B1 | | 6/2002 | McFee | 600/372 |
| 6,408,200 | B1 | * | 6/2002 | Takashina | 600/382 |
| 6,415,169 | B1 | | 7/2002 | Kornrumpf et al. | 600/382 |
| 2002/0072682 | A1 | | 6/2002 | Hopman et al. | 600/509 |
| 2002/0183605 | A1 | * | 12/2002 | Devlin et al. | 600/383 |
| 2003/0060860 | A1 | * | 3/2003 | Foster et al. | 607/72 |
| 2003/0191401 | A1 | | 10/2003 | Oury et al. | 600/509 |

FOREIGN PATENT DOCUMENTS

| | | | |
|---|---|---|---|
| FR | 2 831 046 | 4/2003 | 5/4 |
| WO | WO 02/005711 A1 | 1/2002 | 5/408 |

OTHER PUBLICATIONS

Datascope Corp., 12–Lead Monitoring Redefined, May 1, 2002, 3 pages.

* cited by examiner

*Primary Examiner*—Charles H. Nolan, Jr.
(74) *Attorney, Agent, or Firm*—Jack Schwartz & Associates

(57) ABSTRACT

A wiring harness is provided for conveying signals representing measurements made at a first location to a measuring instrument remotely located from the first location. The harness includes a first cable having an outer sheath with a first diameter and a plurality of coaxial cables arranged within the outer sheath of the first cable. A plurality of contacts is arranged on the outer sheath of the first cable. Each of the contacts is electrically connected to a respective inner conductor of one of the plurality of coaxial cables.

23 Claims, 3 Drawing Sheets

EKG WIRING SYSTEM

The present patent application claims priority from provisional patent application No. 60/408,018 filed on Sep. 4, 2002.

BACKGROUND OF THE INVENTION

1. Field of the Invention

The present invention relates to a wiring harness which conveys electrical signals representing measurements made at a first location to a measuring instrument remotely located from such first location.

2. Background of the Invention

It has been common practice for many years to measure the physiological functions of the human body to determine the health of a patient. This is generally accomplished by attaching electrodes to specific areas so that the functions of particular organs of the body can be determined. For example, it has been common practice to measure electrocardiogram (EKG) signals from a body.

The normal practice for obtaining readouts to form an electrocardiogram has been to adhere electrodes to different portions of the body and then connect each electrode to a wire, which will terminate in an EKG trunk connector. The connector is plugged into a trunk cable which is then attached to the remote measuring electronic instrumentation. The measuring instrument to construct the traditional EKG waveforms for display amplifies the potential differences between pairs of electrodes.

The number of electrodes that may be attached to the human body varies. It depends on the detail of information required from the hardware. In normal clinical practice, between three and ten electrodes may be placed on the body.

It is clear, however, that as the quantity of electrodes is increased, the quantity of EKG wires may become unmanageable. Such wires may often become tangled with themselves. This poses a problem, which can be made worse in a critical care setting, such as in an operating room or intensive care unit of a hospital, where the EKG wires are only one group of many wires going from an electronic instrument such as a monitor to the patient. In this setting, all the cables can get tangled with each other. Accordingly, a lot of skilled nursing time is spent merely untangling the cables.

Previous attempts at improving manageability of EKG wiring harnesses by minimizing tangling include fabricating a plurality of wires in a flat membrane-like multiwire cable where the width of the cable changes with the distance from the measuring instrument. In such an arrangement, each wire of the multiwire cable has its own electrode which provide only a fragile connection and complicates locating the electrode at the correct location on the patient's body.

Also, different types of electrodes have been used to obtain better adherence to the human body. Each such electrode must include a means for connecting that electrode to the monitoring equipment. For example, suction cups have been used as well as self-adhesive cloth containing a metal electrode. In both of these cases, a contact in the EKG wire is then snapped on the metal electrode attached to the self-adhering element. The force required to snap the electrode onto and remove the electrode from the EKG wiring harness can lead to failure in the wiring harness and/or damage to the connector itself.

Another problem is the presence of other electronic equipment, with associated wires and sensors, in close proximity to the EKG wiring harness. Such equipment can cause severe electro-magnetic interference (EMI). In known arrangements, EMI is minimized by using shielded wire, such as coaxial cable, to connect the EKG monitor to the sensors.

Furthermore, in an operating room, electrocautery devices are typically used. An electrocautery device is a surgical knife which is supplied with a relatively high level of radio frequency (RF) current so that blood vessels and other tissues are cauterized and sealed immediately upon cutting. The RF current may be picked up by one EKG sensor, coupled to that sensor wire's shield through the cable capacitance, then to other shields of other sensor wires at a common connection point. The relatively high level of RF current is then supplied to the other EKG sensors where it can cause burns on the patient at the EKG sensor site. Prior art arrangements minimize the conduction of RF energy among the EKG sensor wire shields by providing high potential electrical isolation (on the order of several kilovolts) at least at RF frequencies between respective shields of EKG sensors.

A wiring system which can provide a wiring harness which minimizes the potential for tangling with itself and other wiring harnesses, which minimizes the potential for damage due to connecting and disconnecting the wiring harness to the electrodes, which provides EMI protection and prevents RF burning due to the use of electrocautery devices, is desirable.

BRIEF SUMMARY OF THE INVENTION

A device incorporating the principles of the present invention may include a first cable having an outer sheath with a first diameter. A plurality of coaxial cables is provided. Each of the coaxial cables has a respective outer shield with a diameter substantially smaller than the first diameter of the outer sheath and a respective inner conductor. The coaxial cables are arranged substantially parallel to each other within the outer sheath of the first cable. Also provided are a plurality of first contacts arranged on the outer sheath of the first cable. Each of the first contacts is electrically connected to a respective inner conductor of one of the plurality of coaxial cables.

BRIEF DESCRIPTION OF THE DRAWING

Other features and objects of the present invention will be made clear from the following description of a preferred embodiment taken in conjunction with the accompanying drawings, in which.

DETAILED DESCRIPTION OF THE INVENTION

Figure 1:
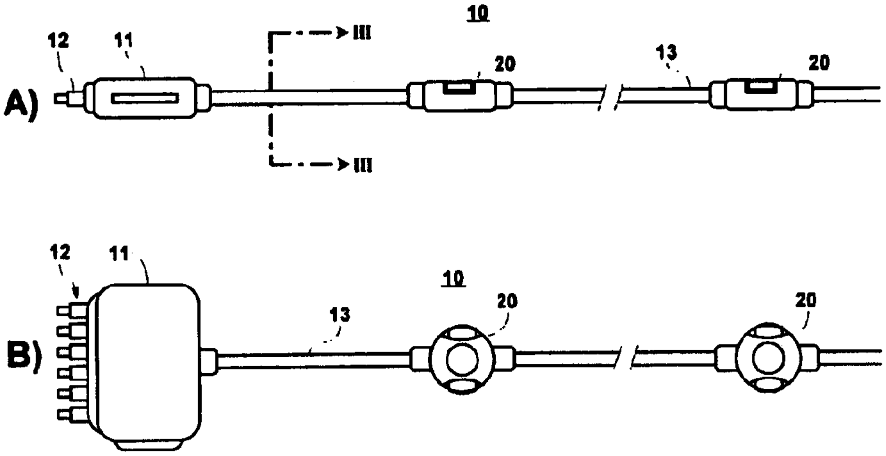
FIG. 1A is a side view of the wiring harness of a preferred embodiment incorporating the features of the present invention.
FIG. 1B is a plan view of the wiring harness shown in FIG. 1A.

Referring to the drawings and more particularly to FIGS. 1A and 1B, a wiring harness 10 has a trunk cable connector 11 having a plurality of terminals 12. The harness 10 has an outer sheath 13. The terminals 12 are electrically connected to respective inner conductors of a plurality of coaxial cables 14 (FIGS. 2 and 3) maintained within the outer sheath 13 of the wiring harness. This can be more clearly seen in FIG. 3 which is a cross sectional view taken along the line III—III of FIG. 1A.

Figure 3:
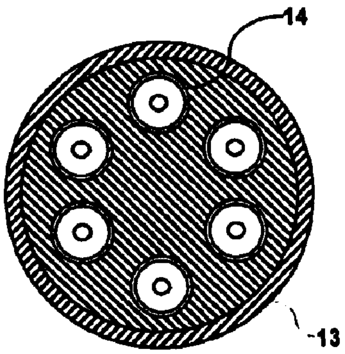
FIG. 3 is a cross-sectional view of the wiring harness taken along the lines III—III of FIG. 1A.

From the cross sectional view of FIG. 3 it can be seen that in this embodiment the wiring harness contains a plurality of coaxial cables, such as represented by the numeral 14, disbursed within the outer sheath 13 of the wiring harness. Each of the coaxial cables has an inner conductor insulated from an outer metallic conductor, which is capable of being electrically grounded. It can be seen that in this preferred embodiment, using the six coaxial cables, it is possible to monitor responses from six separate positions of a person's body. Of course it is clear that the wiring harness can contain more or fewer coaxial cables within the substantially cylindrical outer sheath depending on the type of measurements being made.

Arranged on and spaced along the outer sheath 13 of the harness 14 are a plurality of contacts 20. Each of the contacts 20 is connected respectively to the inner conductor of a respective one of the coaxial cables 14. In a preferred embodiment the contacts may be zero insertion force (ZIF) sockets. ZIF sockets have been developed for use with integrated circuits. Such a socket can be opened and closed by means of a lever or screw. The advantages of utilizing such sockets in the preferred embodiment is that they take up little space and can be connected to the external leads of the electrodes making a positive connection with little or no additional force being applied, and can also be removed with little or no force applied. In accordance with principles of the present invention, each ZIF socket is connected through the outer sheath of the cable 13 to the inner conductor of a respective one of the coaxial cables 14 developed by Nicolay.

It can be seen that in the preferred embodiment the outer sheath of the wiring harness 13 is substantially cylindrical and that the coaxial cables 14 contained therein are substantially parallel to each other. However, in other embodiments the wiring harness 13 may have different sheath and conductor spatial arrangements. For example, the coaxial cables 14 may be arranged in a twisted, helix shape, or the wiring harness may be arranged to have a flattened, elliptical cross-sectional shape.

Figure 2:
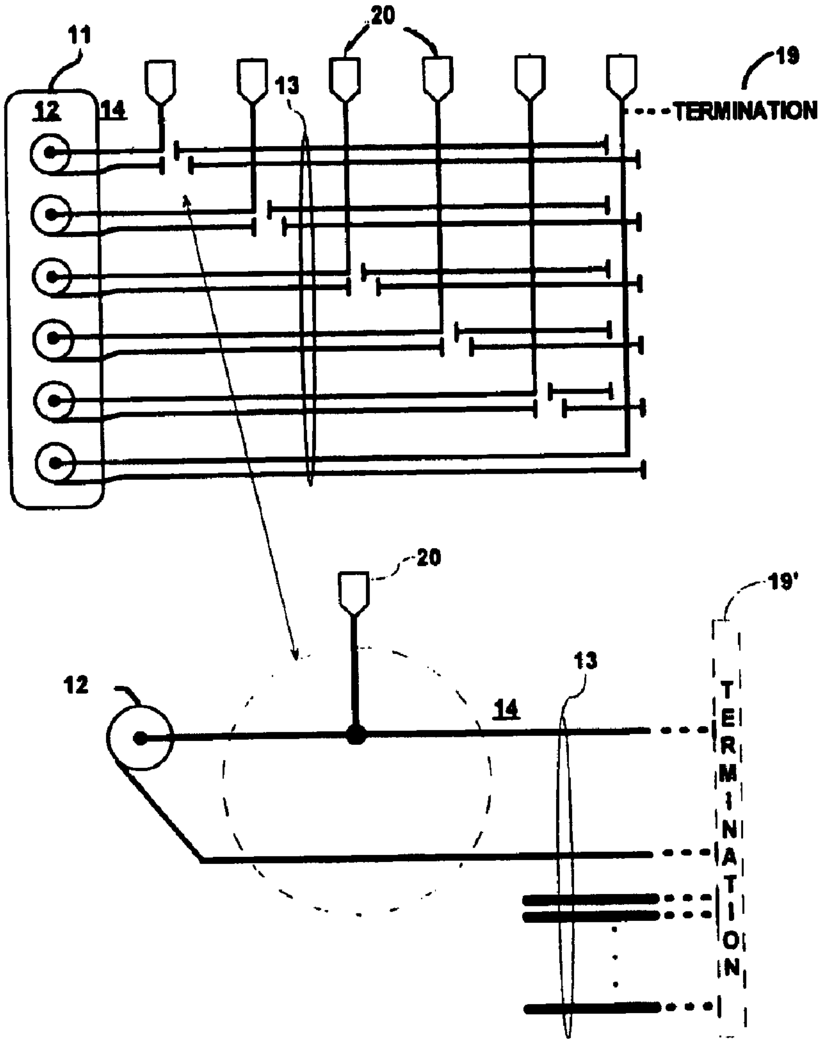
FIG. 2 is a schematic diagram showing the manner in which the electrical connections are made to the wiring harness.

Referring to FIG. 2, the electrical schematic diagram shows each of the contacts 20 being connected respectively to the inner conductor of one of the coaxial cables 14. In one embodiment the outer shields of the coaxial cables 14 may be coupled to a source of reference potential (ground). In another embodiment, however, they may be maintained electrically isolated from each other, and in particular electrically isolated to a relatively high potential. This embodiment permits both EMI filtering and also RF filtering, in the form of a standalone filter unit or circuitry within the monitor, to be interposed between them to prevent the relatively high level RF current from flowing from the outer shield of one coaxial cable to the outer shield of another coaxial cable as a consequence of the use of an electrocautery device, as described above.

In FIG. 2, each coaxial cable 14 is illustrated as being cut (both inner conductor and shield) at the location of its associated contact 20 into a first portion and a second portion. The inner conductor of the first portion is connected between that contact 20 and the associated terminal 12 in the connector 11. The second portion of that coaxial cable 14 continues as a stub from the location of the contact 20 to the end of the wiring harness 13 in order to maintain the size and shape of the wiring harness 13 constant from the connector 11 to the opposite end.

One skilled in the art will understand, however, that the inner conductor and shield of each coaxial cable 14 may run electrically continuous from the connector 11 to the other end of the wiring harness 13. In this embodiment, the contact 20 is connected to the inner connector of its associated coaxial cable 14 as a tap, as illustrated in the circular insert in FIG. 2.

Other embodiments are also possible, including interrupting the inner conductor of the coaxial cable 14 at the location of the contact 20, in the manner illustrated in the main portion of FIG. 2, while the shield of the coaxial cable 14 is electrically continuous from one end of the wiring harness 13 to the other end in the manner illustrated in the circular insert of FIG. 2, or vice versa; and/or fabricating some of the contacts as cuts in the associated coaxial cables 14 and others as taps.

When the signals carried by the coaxial cables 14 have only lower frequencies, no further signal processing is necessary. However, when signal frequencies are higher, it may be necessary to provide impedance matching terminations. In the main portion of FIG. 2, the signal bearing inner conductor runs through the first portion of the coaxial cable 14 from the contact 20 to the terminal 12 in the connector 11. For higher signal frequencies, one or more of the contacts 20 may be fabricated with an associated termination network 19 to provide an impedance matching termination for the associated coaxial cable 14, as illustrated in phantom for the rightmost contact 20 in FIG. 2. The stubs formed by the second portion of the coaxial cables 14 from the location of their associated contacts 20 to the end of the wiring harness 13 opposite the terminals 12 are not electrically connected to the connector 11 and, therefore, to any of the circuitry in the measuring instrument. These stubs simply end. Because they are not electrically connected to any signal processing apparatus, ending these stubs in this manner will not adversely affect the signal transmission characteristics of the wiring harness 13.

In the embodiment described above and illustrated in the insert in FIG. 2, the contacts 20 are connected as taps to the inner conductor of their associated coaxial cable 14 and the inner conductor and shield of the coaxial cable 14 run electrically continuous from the connector 11 to the opposite end of the wiring harness 13. For higher signal frequencies, a termination network 19', illustrated in phantom, is coupled to the distal ends of one or more of the coaxial cables 14. The termination network 19 provides impedance matching terminations for any or all of the coaxial cables 14 in the wiring harness 13.

In all the cases described above, the termination networks prevent signal reflections due to impedance mismatches and are especially important at higher signal frequencies. One skilled in the art will understand how to determine the characteristic impedance of the coaxial cables 14, how to design an appropriate termination network and how to connect the termination network to the distal ends of the coaxial cables 14. One skilled in the art will also understand that such a termination network may be a passive or active network.

The net physical result is a plurality of contacts 20 spaced along the outer sheath of the wiring harness in such manner that only small smooth bulges appear in the wiring harness, as is illustrated in FIGS. 1A and 1B. FIG. 2 also illustrates that each coaxial cable 14 runs from one end of the harness 13 to the other. That is, every coaxial cable 14 is connected to the trunk connector 11 at one end of the cable, and every coaxial cable 14 runs to the opposite end of the harness 13, possibly to the termination 19, if included. This results in the wiring harness 13 having a substantially constant cross-section width (except for the smooth bulges at the locations of the ZIF connectors 20) from one end of the harness 13 to the other.

In use, the wiring harness 10 is placed along the body of the patient to be tested and respective electrodes are connected to the contacts 20 spaced along the cable. When all the connections are made, terminals 12 of the trunk cable connector 11 are electrically connected to electrodes applied to the appropriate positions on the body of the patient under test.

Figure 4:
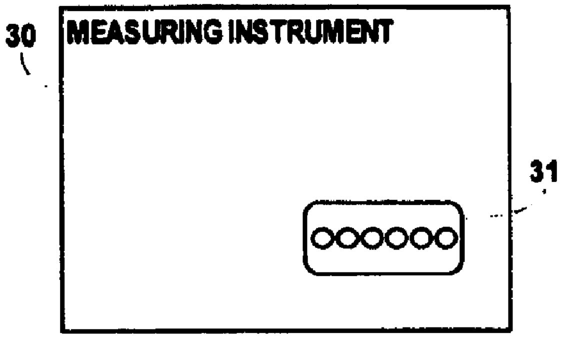
FIG. 4 is a block diagram of a measuring instrument used with the wiring harness of FIGS. 1A and 1B.

FIG. 4 shows, in block diagram form, a measuring instrument 30 which includes a trunk cable connector receptacle 31 adapted to cooperate with the terminals 12 of the trunk cable connector 11 shown in FIGS. 1A and 1B. When the trunk cable connector 11 is plugged into the trunk cable connector receptacle 31 the measuring instrument 30 receives the necessary electrical signals so that the appropriate tests can be performed on the patient and recorded. One skilled in the art will understand that an intermediate filtering module may be connected between the trunk cable connector 11 and the trunk cable connector receptacle 31 to proved EMI and high-level RF filtering, as described above; or that such filtering may be provided by circuitry within the measuring instrument 30. If provided within the measuring circuitry 30, the filtering circuitry may be switchable.

The apparatus incorporating the principles of the present invention uses a single cable 13 which is connected from the patient to the monitor 30. The cable 13 is made from a plurality of coaxial cables 14, one of such cables being used for each electrode to be applied to the patient. An impedance matching termination network may possibly be coupled to the coaxial cables. Because of the nature of the coaxial cable it is evident that the outer wire of each such cable can shield any electrical signals appearing on the inner conductor and traveling from the patient to the measuring instrument 30. Because the shields of the coaxial cables remain isolated from each other, filtering circuitry to prevent high level RF power generated by electrocautery devices from appearing at the electrode locations may be included in the EKG system. The zero insertion force connectors 20 are placed at different positions along the cable 13 so that connections to the electrodes applied to the patient can easily be made. These ZIF connectors 20 are attached to the electrodes on the body starting at one end and finishing at the other end so that the cable 13 can snake around the body to each of the electrode sites. In this way a single wiring harness cable 13 is used instead of an individual wires for each electrode.

As illustrated in the drawings, the ZIF connectors 20 for the electrodes are designed in such a way that they become a smooth bulge in the cable. As noted above, this is important so that when the EKG cable becomes tangled with another cable, such as pulse oximetry cable, it can be easily untangled by simply pulling the cable/cables apart. The smooth bulges will easily pass through the tangles from the other cables. It is clear that as the number of required electrodes are increased or decreased depending on the tests to be performed on the patient, an appropriate wiring harness can be arranged incorporating the principles of the present invention so that the overall diameter of the wiring harness 13 can be maintained at a minimum diameter to avoid interfering with the possibility of other cables also being attached to the patient at the same time.

The present invention has been described with respect to a particular embodiment and a particular illustrative example, it is evident that the principles of the present invention may be embodied in other arrangements without departing from the scope of the present invention as defined by the following claims.

What is claimed is:

1. A wiring harness for conveying signals representing measurements made at a first location to a measuring instrument remotely located from said first location, said harness comprising:

a first cable having an outer sheath with a first diameter;

a plurality of coaxial cables, each of said coaxial cables having an outer shield with a diameter substantially smaller than said first diameter and a corresponding inner conductor, said coaxial cables being arranged within said outer sheath of said first cable;

a plurality of first contacts arranged on said outer sheath of said first cable, each of said contacts being electrically connected to the inner conductor of a respective one of said plurality of coaxial cables.

2. A wiring harness as claimed in claim 1 wherein the coaxial cables are arranged within said outer sheath of said first cable substantially parallel to each other.

3. A wiring harness as claimed in claim 1 wherein said first cable has a predetermined length and said contacts are spaced from each other along said length of said cable.

4. A wiring harness as claimed in claim 3 wherein said contacts are substantially equally spaced from each other along said predetermined length of said cable.

5. A wiring harness as claimed in claim 1 wherein said contacts are zero insertion force connectors.

6. A wiring harness as claimed in claim 1 wherein the plurality of coaxial cables are coupled to a termination network.

7. A wiring harness as claimed in claim 1 wherein one end of said first cable is terminated in a trunk cable connector having a plurality of first terminals, each of said first terminals being respectively connected to the inner connector of one of said plurality of coaxial cables.

8. A wiring harness as claimed in claim 7 wherein the plurality of coaxial cables are coupled to a termination network at the other end of said first cable.

9. A wiring harness as claimed in claim 7 wherein the measuring instrument comprises a trunk cable connector receptacle with second terminals adapted to cooperate with said first terminals of said trunk cable connector so that when said terminals of said receptacle and said trunk cable connector are in electrical contact, any electrical signals received by said first contacts are transmitted to said measuring instrument via said inner conductors and said terminals of said trunk connector.

10. The wiring harness as claimed in claim 9 wherein each of the plurality of coaxial cables is cut at the location of the associated first contact into a first portion and a second portion electrically isolated from each other, wherein the inner conductor of the first portion is connected between the first contact and the associated second terminal.

11. A wiring harness as claimed in claim 1 wherein said first cable is flexible and substantially cylindrical.

12. A wiring harness as claimed in claim 1 wherein said first location is a where a patient is under test and said measuring instrument is an electrocardiogram apparatus.

13. A wiring harness as claimed in claim 1 wherein the outer shield of each of said coaxial cables is capable of being electrically grounded to shield any signals on said inner conductors from outside electrical interference.

14. A wiring harness as claimed in claim 1 wherein the outer shields of each of said coaxial cables are electrically isolated from each other.

15. A wiring harness as claimed in claim 14 wherein the outer shields of each of said coaxial cables are electrically isolated from each other to a relatively high potential.

16. A wiring harness as claimed in claim 1 wherein each of said contacts provides a smooth bulge along said outer sheath of said first cable.

17. A wiring harness as claimed in claim 1 wherein the plurality of coaxial cables run from one end of the first cable to the other end of the first cable.

18. The wiring harness as claimed in claim 17 wherein each of the plurality of coaxial cables is cut at the location of the associated first contact into a first portion and a second portion electrically isolated from each other, wherein the inner conductor of the first portion is connected to the associated first contact.

19. The wiring harness as claimed in claim 17 wherein each of the plurality of coaxial cables runs electrically continuous from one end of the first cable to the other end of the first cable and the associated first contact is connected as a tap to the inner conductor of the coaxial cable at the location of the first contact.

20. An EKG wiring harness for conveying signals derived from multiple patient attached electrodes, comprising:

a single cylindrical cable of substantially uniform diameter along its length including:

- a plurality of individual coaxial cables, with independent grounds, for conveying EKG signals, and
- a plurality of fastening devices terminating said plurality of coaxial cables at intermediate positions along the length of said single cylindrical cable; and
- a connector terminating one end of said single cylindrical cable including a plurality of contacts coupled to inner conductors of said plurality of coaxial cables.

21. An EKG wiring harness according to claim 20 wherein said plurality of fastening devices provide smooth bulges along said cylindrical cable supporting extraction of said cylindrical cable from tangled external wires by a user applying physical pulling force.

22. An EKG wiring harness according to claim 20 wherein said fastening devices have a zero insertion force mechanism for electrode connector coupling.

23. An EKG wiring harness according to claim 20 wherein the wiring harness further comprises a termination network coupled to the plurality of individual coaxial cables at the other end of said single cylindrical cable.

* * * * *